United States Patent
Nagaraj et al.

(10) Patent No.: US 10,466,286 B2
(45) Date of Patent: Nov. 5, 2019

(54) CAPACITIVE SENSING

(71) Applicant: Texas Instruments Incorporated, Dallas, TX (US)

(72) Inventors: Krishnasawamy Nagaraj, Plano, TX (US); Paul Kimelman, Alamo, CA (US); Abhijit Kumar Das, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/845,898

(22) Filed: Dec. 18, 2017

(65) Prior Publication Data
US 2018/0106844 A1    Apr. 19, 2018

Related U.S. Application Data

(63) Continuation of application No. 14/189,447, filed on Feb. 25, 2014, now Pat. No. 9,846,185.

(60) Provisional application No. 61/770,116, filed on Feb. 27, 2013.

(51) Int. Cl.
G01R 27/26    (2006.01)
(52) U.S. Cl.
CPC .................. G01R 27/2605 (2013.01)
(58) Field of Classification Search
CPC .................................................. G01R 27/2605
USPC ......................................................... 324/684
See application file for complete search history.

(56) References Cited

U.S. PATENT DOCUMENTS

| | | | |
|---|---|---|---|
| 3,889,133 A * | 6/1975 | Oka | G01R 15/002 327/429 |
| 4,154,980 A | 5/1979 | Schmidt et al. | |
| 5,657,238 A * | 8/1997 | Lindeboom | G01R 27/02 324/677 |
| 6,594,613 B1 | 7/2003 | Ley et al. | |
| 7,307,485 B1 | 12/2007 | Snyder et al. | |
| 7,574,620 B2 | 8/2009 | Hartung | |
| 7,576,620 B2 * | 8/2009 | Shen | H04J 13/00 327/164 |
| 7,986,193 B2 | 7/2011 | Krah | |
| 8,570,053 B1 * | 10/2013 | Ryshtun | G01R 27/2605 324/678 |
| 8,698,511 B2 * | 4/2014 | Wendt | B60R 21/01532 324/658 |

(Continued)

FOREIGN PATENT DOCUMENTS

| WO | WO 2013177760 A1 * | 12/2013 | ......... G01R 27/2605 |
|---|---|---|---|
| WO | WO2013177760 A1 | 12/2013 | |

OTHER PUBLICATIONS

Aaron GL Podbelski, "Cypress' CapSense Sigma-Delta Algorithm", Cypress Semiconductor White Paper, available at: http://www.cypress.com/file/73326, Nov. 2007, pp. 1-6.

(Continued)

*Primary Examiner* — Melissa J Koval
*Assistant Examiner* — Rahul Maini
(74) *Attorney, Agent, or Firm* — Ebby Abraham; Charles A. Brill; Frank D. Cimino

(57) ABSTRACT

A system includes a controller, a node connected to one side of a capacitance, the controller configured to measure the capacitance by measuring a time for a voltage across the capacitance to reach a predetermined reference voltage, and the controller causing the time period for capacitance measurements to vary even when the capacitance is constant.

17 Claims, 4 Drawing Sheets

(56) References Cited

U.S. PATENT DOCUMENTS

| | | |
|---|---|---|
| 2009/0009195 A1 | 1/2009 | Seguine |
| 2011/0242048 A1 | 10/2011 | Guedon et al. |
| 2012/0200524 A1 | 8/2012 | Vallis et al. |
| 2012/0268415 A1* | 10/2012 | Konovalov ........... G06F 3/0418 345/174 |
| 2013/0015866 A1 | 1/2013 | Wendt et al. |
| 2014/0057681 A1* | 2/2014 | Grivas .................... G06F 3/044 455/566 |
| 2014/0239977 A1 | 8/2014 | Nagaraj et al. |

OTHER PUBLICATIONS

Seguine, Ryan, "Capacitive Sensing Techniques and Considerations", published in Mobile Handset DesignLine, available at: http://www.cypress.com/file/72986/download, Nov. 2007, pp. 1-7.
Patent Prosecution History in U.S. Appl. No. 14/189,447, from Feb. 25, 2014 to Nov. 29, 2017 (480 pages).

* cited by examiner

CAPACITIVE SENSING

This application is a continuation of U.S. patent application Ser. No. 14/189,447, filed Feb. 25, 2014, which claims the benefit of U.S. Provisional Application No. 61/770,116 filed Feb. 27, 2013, both of which are hereby incorporated by reference. This application is related to co-pending U.S. patent application Ser. No. 14/189,461 filed Feb. 25, 2014.

BACKGROUND

Capacitive sensing measures a capacitance resulting from two or more conductive surfaces separated by a dielectric. Capacitive sensing is commonly used to detect a change in capacitance resulting from the proximity of a human hand, a touch of a human finger, or a touch of a conductive stylus. Capacitive sensing is commonly used for human interfacing with electronic systems, for example; mobile phones, tablet computers, electronic games, electronic instruments, appliances, automotive systems, and industrial systems.

There are many alternative methods for capacitive sensing. For example, a capacitance may be measured by using the capacitance in an oscillator and measuring the frequency of oscillation. Alternatively, a capacitance may be measured by measuring the attenuation of an AC signal. Alternatively, a capacitance can be measured by measuring the time required to charge the capacitance through a known resistance. Each alternative measurement method has inherent advantages, limitations and tradeoffs involving accuracy, cost, response-time, and so forth. In general, capacitive measurement circuits are affected by temperature, humidity, and electrical noise. There is an ongoing need for improved capacitive sensing.

DETAILED DESCRIPTION

Figure 1A:
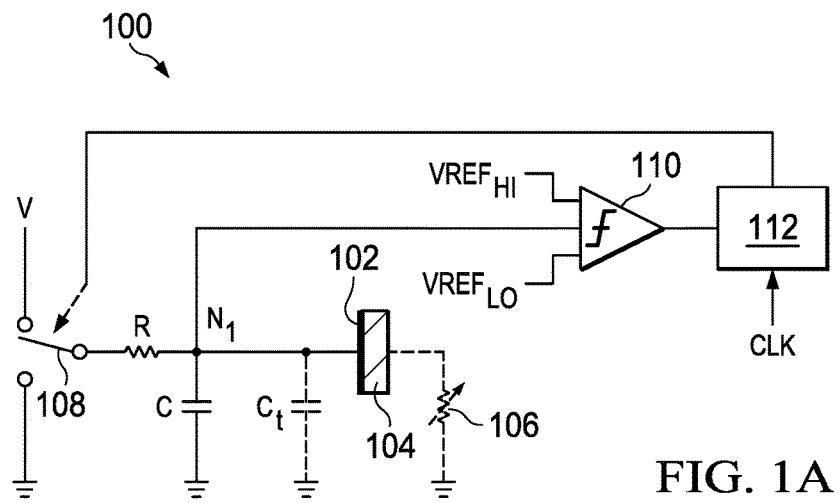
FIG. 1A is a block diagram schematic of an example capacitive sensing system.

FIG. 1A is a simplified block diagram of an example system 100 for illustrating some basic principles for one particular method for capacitive sensing. In the example of FIG. 1A, a change in capacitance is measured by measuring the time required to charge or discharge the capacitance. In FIG. 1A, a conductive capacitive plate 102 is separated from electrical ground by a dielectric 104. The dielectric 104 may be, for example, glass or air. An object 106 (for example, a human, depicted by an unknown variable resistance) provides a conductive path from the dielectric 104 to ground. There is an effective variable capacitance $C_t$ formed by the conductive plate 102, the dielectric 104, and the object 106. $N_1$ designates the node connecting the conductive plate 102 to the remaining circuitry. A switch 108 couples node $N_1$ to a voltage V or to ground. A capacitance C may be, for example, the total line capacitance resulting from all conductive traces connected to node $N_1$. Likewise, a resistance R may be the total resistance between the source of the voltage V and node $N_1$ (for example, the resistance of conductive traces and the resistance of switch 108).

The switch 108 is controlled by a timer/controller 112. When the switch 108 switches to the voltage V, the parallel capacitances (C and $C_t$) start charging. A comparator 110 compares the voltage at node $N_1$ to a high reference voltage $VREF_{HI}$ and to a low reference voltage $VREF_{LO}$. The timer/controller 112 measures the time from the moment that the switch 108 switches to the voltage V until the voltage at node $N_1$ equals the high reference voltage $VREF_{HI}$. When the comparator 110 switches states, the timer/controller causes the switch 108 to switch to ground and the combined capacitances (C and $C_t$) start discharging. If, for example, a person (106) is touching the dielectric 104 (or just in proximity to the conductive plate 102), then the effective capacitance $C_t$ is relatively large, and the parallel combination of capacitances (C and $C_t$) charges relatively slowly. If there is no object 106 present, then the effective capacitance $C_t$ is relatively small, and the parallel combination of capacitances (C and $C_t$) charges relatively rapidly.

Figure 1B:
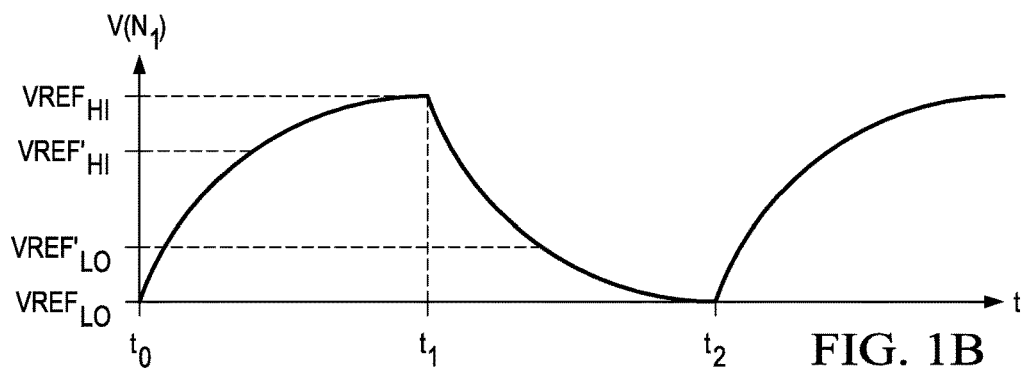
FIG. 1B is a timing diagram for a voltage waveform in the capacitive sensing system of FIG. 1A.

FIG. 1B illustrates an example waveform at node $N_1$. At time $t_0$ the timer/controller 112 causes switch 108 to switch to the voltage V and the capacitances (C and $C_t$) chart charging. At time $t_1$, the voltage at node $N_1$ reaches the high reference voltage $VREF_{HI}$ and the comparator 110 switches states. Also at time $t_1$, the timer/controller 112 causes switch 108 to switch to ground and the capacitances (C and $C_t$) start to discharge. At time $t_2$, the voltage at node $N_1$ reaches the low reference voltage $VREF_{LO}$ and the timer/controller 112 starts another timing period (causes switch 108 to switch to voltage V).

The system 100 is subject to numerous accuracy limitations. First, electrical noise on node $N_1$ can affect when the comparator 110 switches states. Node $N_1$ may be affected by both radiated and conducted electrical noise. The conductive plate 102 may receive electrical noise from unintended electric fields and node $N_1$ may receive noise coupled from other electrical traces. In addition, node $N_1$ may be affected by electrical noise on the power supply lines and on the ground lines. If capacitive measurements are made periodically, then a particular concern is periodic noise having the same period as the measurements. Second, if the timer 112 is a digital counter counting clock pulses (CLK) then there is some inherent inaccuracy (resolution) in the digital measurement of time. Third, the resistance R and the capacitances C and $C_t$ may vary with temperature and humidity.

As illustrated in the example of FIG. 1B, the rate of change of the voltage at node $N_1$ slows as the voltage at node $N_1$ increases towards the voltage V. If the high reference voltage $VREF_{HI}$ is close to the voltage V, then there is a relatively long time during which the voltage at node $N_1$ is close to the high reference voltage $VREF_{HI}$.

Likewise, if the low reference voltage $VREF_{LO}$ is close to ground, then there is a relatively long time during which the voltage at node N1 is close to the low reference voltage $VREF_{LO}$. During the periods of time when the voltage at node N1 is close to one of the reference voltages ($VREF_{HI}$, $VREF_{LO}$), a small amount of noise can cause the comparator 110 to switch states at an inappropriate time (or to not switch states at the appropriate time). One way to improve noise immunity for the system of FIG. 100 is to set the reference voltages ($VREF_{HI}$, $VREF_{LO}$) at levels where the slope of the voltage at node $N_1$ is relatively high. For example, if $VREF_{LO}$ is set to 0.2*V and if $VREF_{HI}$ is set to 0.8*V, then the noise must be at least 0.2*V to cause the comparator 110 to switch states at an inappropriate time. These thresholds are depicted in FIG. 1B by $VREF_{LO}'$ and $VREF_{HI}'$.

For the example of FIG. 1A, the timer/controller 112 may measure the time for node $N_1$ to charge and/or discharge to the reference voltages ($VREF_{HI}$, $VREF_{LO}$). Alternatively, the timer/controller 112 may measure the number of charge/discharge cycles that occur during a fixed period of time.

Figure 2A:
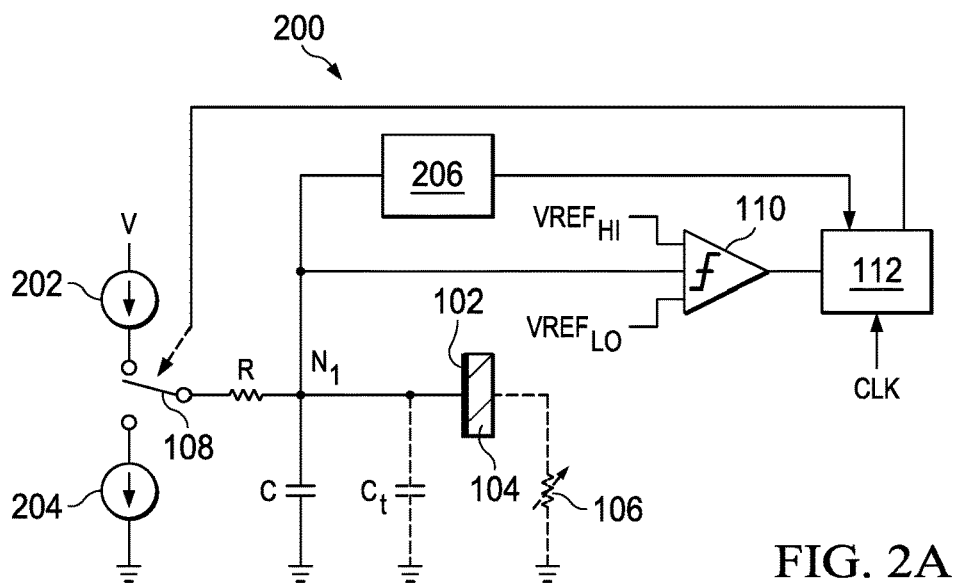
FIG. 2A is a block diagram schematic of an example alternative embodiment of the capacitive sensing system of FIG. 1A.
Figure 4A:
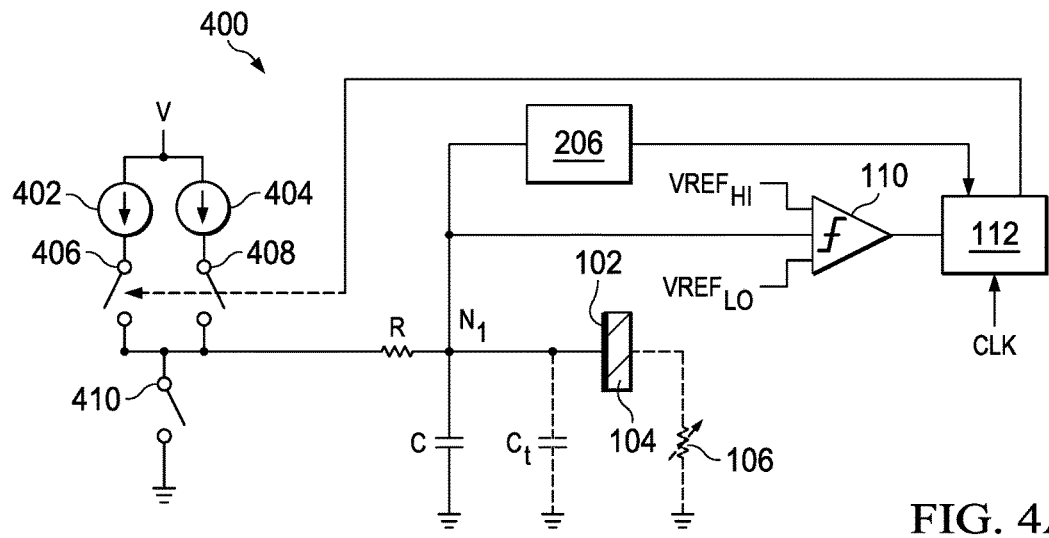
FIG. 4A is a block diagram of an alternative example embodiment of the capacitive sensing systems of FIGS. 1A and 2A.
Figure 4B:
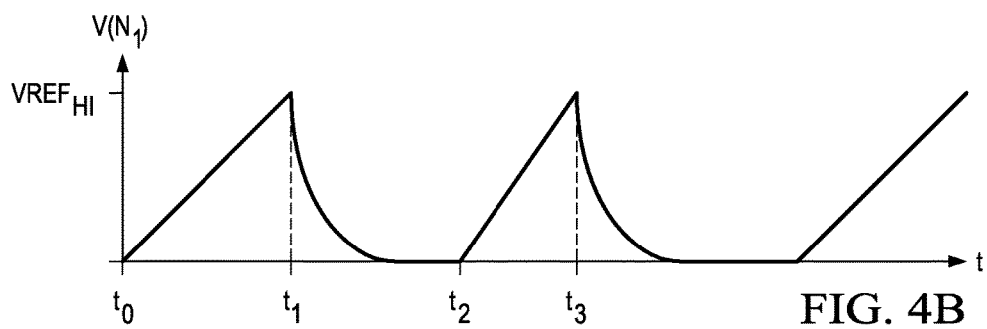
FIG. 4B is a timing diagram for an example voltage waveform in the capacitive sensing system of FIG. 4A.

FIGS. 2A and 4A illustrate example systems with several improvements to the system 100 in FIG. 1A. One improvement is that at least one constant current source is used to charge and/or discharge the capacitances (C and $C_t$). This causes the capacitances to charge and/or discharge linearly instead of charging and discharging with a decreasing slope. Linear charging and discharging reduces the time that the input to the comparator 110 is close to one of the reference voltage thresholds ($VREF_{HI}$, $VREF_{LO}$), and therefore reduces the time window in which the comparator 110 is sensitive to noise. In addition, a current source may overdrive some noise on node $N_1$. A second improvement is that the measurements may be controlled to be a-periodic even when the capacitance (parallel C and $C_t$) is constant. This reduces the effects of periodic noise. One method for making the measurements a-periodic is illustrated in FIG. 2D and a second method for making the measurements a-periodic is illustrated in FIGS. 4A and 4B. A third improvement is that noise on node $N_1$ may be measured to enable the system to compensate for noise, and/or to avoid measurements when the noise is too high, and/or to reject measurements that may have been subjected to unusual bursts of noise. A fourth improvement is to reject measurements that lie outside expected limits.

In FIG. 2A, elements having the same reference numbers as in FIG. 1A are all as described in conjunction with FIG. 1A. In the example system 200 of FIG. 2A, there are two current sources 202 and 204. At any given time, at most one of the current sources 202 and 204 is coupled to node $N_1$. As discussed in conjunction with FIGS. 2C and 2D, one current source 202 or 204 may be optional.

Figure 2B:
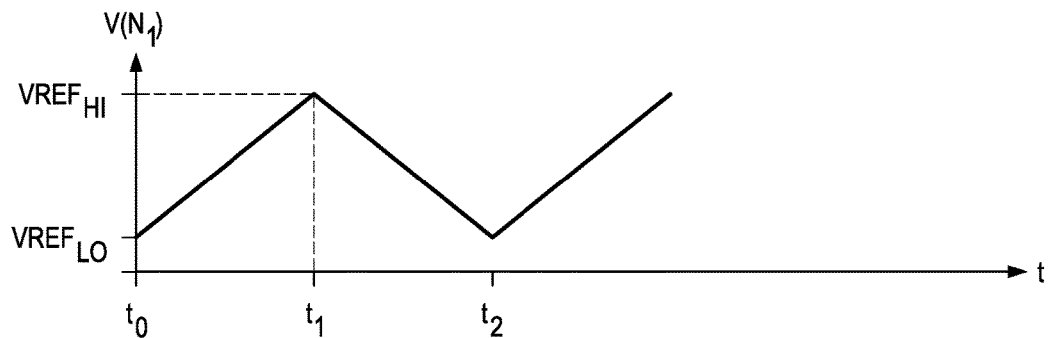
FIG. 2B is a timing diagram for an example voltage waveform in the capacitive sensing system of FIG. 2A.

FIG. 2B illustrates an example waveform for node $N_1$ in FIG. 2A. At time $t_0$, the timer/controller 112 causes switch 108 to switch to current source 202 and the capacitances (C and $C_t$) start linearly charging. At time $t_1$, the voltage at node $N_1$ reaches the high reference voltage $VREF_{HI}$ and the comparator 110 switches states. Also at time $t_1$, the timer/controller 112 causes switch 108 to switch to current source 204 and the capacitances (C and $C_t$) start to linearly discharge. At time $t_2$, the voltage at node $N_1$ reaches the low reference voltage $VREF_{LO}$ and the timer/controller 112 starts another timing period (causes switch 108 to switch to current source 202). Note that linear charging and discharging reduces the time that the input to the comparator 110 is close to one of the reference voltage thresholds ($VREF_{HI}$, $VREF_{LO}$), and therefore reduces the time window in which the comparator 110 is sensitive to noise.

Figure 2C:
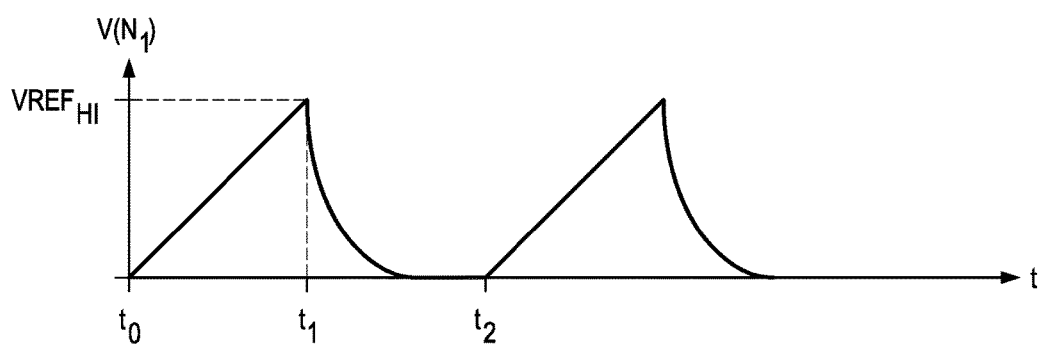
FIG. 2C is a timing diagram for an alternative example voltage waveform in the capacitive sensing system of FIG. 2A.
Figure 2D:
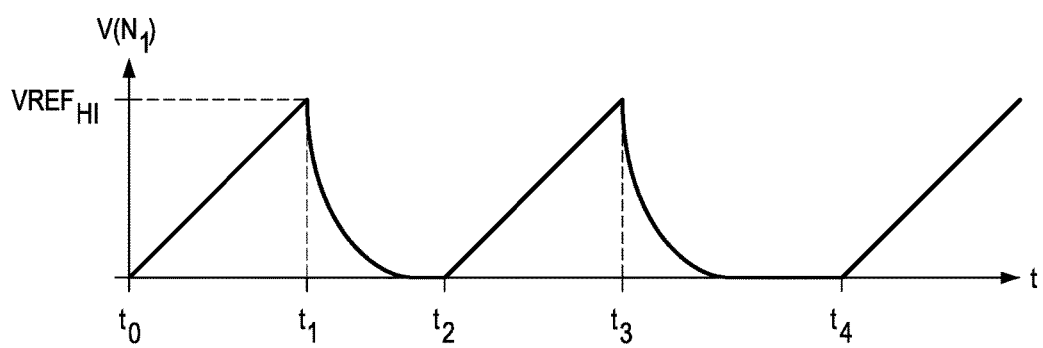
FIG. 2D is a timing diagram for an alternative example voltage waveform in the capacitive sensing system of FIG. 2A.

FIG. 2C illustrates an example waveform for node $N_1$ for an alternative embodiment of the system 200 of FIG. 2A. For FIG. 2C, assume there is no current source 204 and instead, switch 108 couples node $N_1$ to current source 202 or to ground. For FIG. 2C, also assume that the timer/controller 112 determines the time at which each new timing period begins independent of when the voltage at node $N_1$ falls to the low reference voltage $VREF_{LO}$. At time $t_0$, the timer/controller 112 causes switch 108 to switch to current source 202 and the capacitances (C and $C_t$) start linearly charging. At time $t_1$, the voltage at node $N_1$ reaches the high reference voltage $VREF_{HI}$ and the comparator 110 switches states. Also at time $t_1$, the timer/controller 112 causes switch 108 to switch to ground and the capacitances (C and $C_t$) start to discharge. At time $t_2$ the timer/controller 112 starts another timing period (causes switch 108 to switch to current source 202).

The voltage on node $N_1$ in FIG. 2A as depicted in FIG. 2C may be susceptible to noise having the same timing. In the example of FIG. 2C, the measurement time period from $t_1$ to $t_2$ is determined by the timer/controller 112. This measurement time period from $t_1$ to $t_2$ may be randomized by the timer/controller 112 to cause the time period for capacitance measurements to vary even when the capacitance (parallel C and $C_t$) is constant. For example, the timer controller 112 may generate a pseudo-random time period for the time from $t_1$ to $t_2$. Alternatively, the timer controller 112 may pseudo-randomly choose from two or more predetermined time periods. An example a-periodic waveform is illustrated in FIG. 2D. In FIG. 2D, the time period from $t_1$ to $t_2$ is not equal to the time period from $t_3$ to $t_4$. Note that in the examples of FIGS. 2C and 2D, charging is linear but discharging is non-linear (current source 202 but not current source 204). Alternatively, the system 200 may be configured so that discharging is linear and charging is non-linear (current source 204 but not current source 202) and the timer/controller 112 may vary the charging times. Alternatively, both charging and discharging may be linear or non-linear, and the timer/controller 112 may vary either the charging time period or the discharging time period.

Figure 3A:
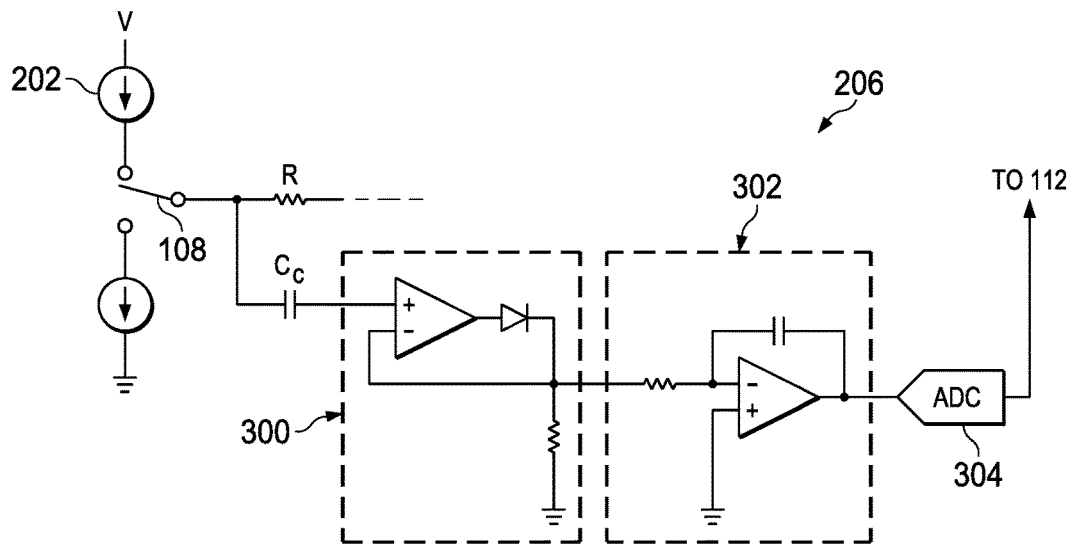
FIG. 3A is a block diagram schematic of an example embodiment of a noise detection circuit in the system of FIG. 2A.

The system 200 in FIG. 2A includes a noise measurement circuit 206. FIG. 3A illustrates additional detail for one example embodiment of the noise measurement circuit 206 in FIG. 2A. Only part of FIG. 2A is duplicated in FIG. 3A to facilitate illustration and discussion. In the example of FIG. 3A, the switch 108 is coupled to a rectifier circuit 300, followed by an integrator 302, followed by an analog-to-digital converter (ND) 304. The output of the ND 304 is read by the timer/controller 112. The measurement circuit 206 may optionally be capacitively coupled (capacitor $C_C$). Assuming that resistance R (trace resistance) is small, the circuit of FIG. 3A effectively measures noise on node $N_1$ and integrates the noise over time. The ND 304 then provides a digital measure of that noise to the timer/controller 112. If the circuit of figure 3A is capacitively coupled (capacitor $C_C$), then the circuit of FIG. 3A measures AC noise, and may be used whether the switch 108 is switched or not-switched to one of the current sources (202, 204).

Figure 3B:
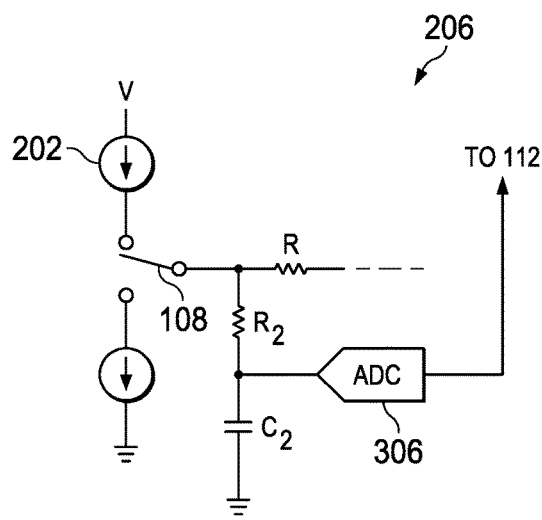
FIG. 3B is a block diagram schematic of an example embodiment of an alternative noise detection circuit in the system of FIG. 2A.

FIG. 3B illustrates additional detail for an alternative example embodiment of the noise measurement circuit 206 in FIG. 2A. Only part of FIG. 2A is duplicated in FIG. 3B to facilitate illustration and discussion. In the example of FIG. 3B, when the switch 108 is switched to current source 202, a known capacitance $C_2$ charges through a known resistance $R_2$. An A/D 306 measures the voltage on capacitance $C_2$ after a known period of time and the output of the A/D 306 is read by the timer/controller 112. Assuming that resistance R (trace resistance) is small relative to resistance $R_2$, the circuit of FIG. 3A effectively measures noise on node $N_1$. With calibration, the expected voltage on capacitance $C_2$ after the known period of time is known. If the actual voltage is significantly different than the expected voltage, the difference is assumed to be caused by noise.

For either example of noise measurement circuit 206, the noise measurement may be used change at least one capacitance measurement parameter. For example, the system 200 may determine that the noise is too great to initiate a capacitance measurement and the capacitance measurement may be deferred. Alternatively, the noise measurement may be used to determine whether a capacitance measurement is valid so capacitance measurements may be rejected if capacitance measurements are subject to excess noise. Alternatively, the reference voltages ($VREF_{HI}$, $VREF_{LO}$) may be adjusted based on noise level. For example, $VREF_{HI}$ may be adjusted closer to the supply voltage and $VREF_{LO}$ may be adjusted closer to ground if the noise level is relatively low. Alternatively, the timer/controller 112 may have an expected range of charging time periods (for example, FIG. 2C, $t_0$ to $t_1$ and $t_2$-$t_3$) and the timer/controller 112 may reject measurements having a charging time period outside the expected range. The expected range may be reduced if the noise measurement circuit 206 indicates that noise is relatively low.

FIG. 4A illustrates an example embodiment of a system 400 that is an alternative embodiment of the system 200 of FIG. 2A, illustrating an alternative way of ensuring that the time period for capacitance measurements is variable even when the capacitance (parallel C and $C_t$) is constant. In FIG. 4A, elements having the same reference numbers as in FIGS. 1A and 2A are all as described in conjunction with FIGS. 1A and 2A. In the example of FIG. 4A, there are at least two current sources (402, 404) that may be coupled to node $N_1$ by switches (406, 408) controlled by the timer/controller 112. In the example of FIG. 4A, node $N_1$ is discharged by a switch 410 instead of by a current source to ground, but a current source to ground may optionally be used. The currents sourced by current sources 402 and 404 are not equal. Accordingly, the time periods required for node $N_1$ to charge to the high reference voltage $VREF_{HI}$ are not equal because the currents provided by the different current sources are not equal. The timer/controller may select switches 406 and 408 in a pseudo-random sequence so that the voltage waveform on node $N_1$ is a-periodic even when the capacitance (parallel C and $C_t$) is constant. Alternatively, the system 400 may be configured so that a plurality of current sources are used to discharge, and the time periods required for node $N_1$ to discharge to the low reference voltage $VREF_{LO}$ are made to be unequal.

FIG. 4B illustrates an example waveform on node $N_1$ of FIG. 4A. At time $t_0$, switch 406 switches current source 402 to node $N_1$ and the capacitances (C and $C_t$) linearly charge until the voltage at node $N_1$ equals the high reference voltage $VREF_{HI}$. At time $t_1$, switch 410 is closed to discharge the capacitances. At time $t_2$, switch 410 opens and switch 408 closes to switch current source 404 to node $N_1$ and the capacitances (C and $C_t$) linearly charge until the voltage at node $N_1$ equals the high reference voltage $VREF_{HI}$. Note that since current source 402 is not identical to current source 404, the time period from $t_0$ to $t_1$ is different than the time period from $t_2$ to $t_3$. Switches 406 and 408 are closed in a pseudo-random sequence so that the resulting voltage waveform on node $N_1$ is a-periodic.

Figure 5:
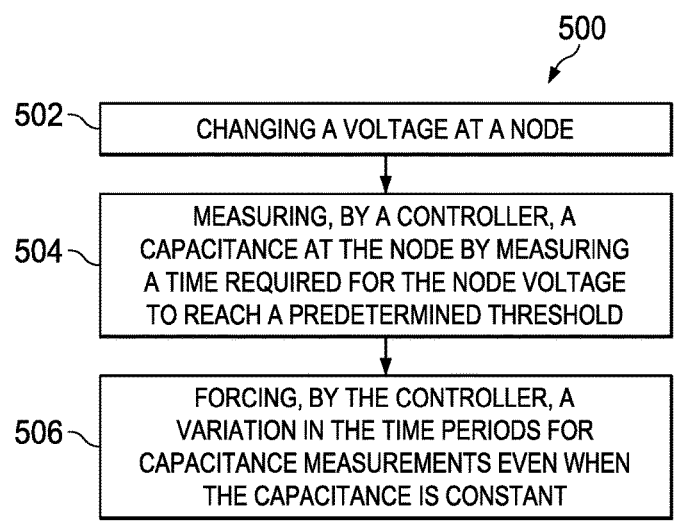
FIG. 5 is a flow chart illustrating an example embodiment of a method for capacitive sensing.

FIG. 5 illustrates an example method 500 for capacitive sensing. Note, the particular order of steps as illustrated does not mean that the steps must be performed in the illustrated order, and some steps may be performed simultaneously. At step 502 a voltage at a node is changed. At step 504 a controller measures a capacitance at the node by measuring a time required for the node voltage to equal a predetermined threshold. At step 506, a controller forces a variation in the time periods for capacitance measurements even when the capacitance is constant.

Note that illustrating the timer/controller 112 as one functional unit is only to facilitate illustration and discussion, and the timing and controlling functions may be implemented by separate functional units. Likewise, illustration of the comparator 110, the timer/controller 112, the noise measurement circuit 206, the ND 304, and the ND 306 as separate functional units is only to facilitate illustration and discussion, and the timer/controller 112 may include any or all of the separately labeled functions.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A system, comprising:
   a voltage source;
   a ground terminal;
   a controller;
   a switch coupled to the controller and having a first terminal, a second terminal, and a third terminal, the first terminal coupled to the voltage source, the second terminal coupled to the ground terminal,
   a capacitor having a first terminal and coupled to the third terminal of the switch;
   a comparator coupled between the first terminal of the capacitor and the controller, wherein the comparator is configured to compare a voltage at the first terminal of the capacitor with a high reference voltage;
   responsive to a control signal from the controller, the switch configured to:
      adjust to a first position at a first time, wherein the first position connects the first terminal to the third terminal;
      adjust to a second position at a second time when the voltage at the first terminal of the capacitor is equal to or above the high reference voltage, wherein the second position connects the second terminal to the third terminal;
      adjust to the first position at a third time; and
      adjust to the second position at a fourth time, wherein a time difference between the second time and first time is different than a time difference between the fourth time and third time.

2. The system of claim 1, wherein the controller determines the third time based in part on a pseudo-random sequence.

3. The system of claim 1, wherein the controller determines the fourth time based in part on a pseudo-random sequence.

4. The system of claim 1, where the controller determines the third time by randomly choosing from two or more predetermined times.

5. The system of claim 1, where the controller determines the fourth time by randomly choosing from two or more predetermined times.

6. The system of claim 1, wherein the voltage source is a first voltage source; and further comprising a second voltage source that is coupled to the switch; and wherein the controller is further configured to adjust the switch to a third position, wherein the third position connects the switch to the second voltage source.

7. The system of claim 1, further comprising:

a noise measurement circuit coupled between the first terminal of the capacitor and the controller, the noise measurement circuit configured to:

measure electrical noise on the first terminal of the capacitor; and transmit the measured electrical noise to the controller.

8. The system of claim 7, wherein the controller is further configured to adjust at least one measurement parameter in response to receiving the measured electrical noise from the noise measurement circuit.

9. The system of claim 7, wherein the controller is further configured to defer measuring a capacitance in response to receiving the measured electrical noise from the noise measurement circuit.

10. The system of claim 7, wherein the controller is further configured to reject a capacitive measurement in response to receiving the measured electrical noise from the noise measurement circuit.

11. The system of claim 7, wherein the controller is further configured to adjust the high reference voltage in response to receiving the measured electrical noise from the noise measurement circuit.

12. A method, comprising:

adjust, by a controller, a switch to a first position at a first time, wherein the first position connects a capacitor to a voltage source;

adjust, by the controller, the switch to a second position at a second time when a voltage at a first terminal of the capacitor is equal to a high reference voltage, wherein the second position connects the capacitor to a ground terminal;

adjust, by the controller, the switch to the first position at a third time; and adjust, by the controller, the switch the second position at a fourth time, wherein a time difference between the second time and first time is different than a time difference between the fourth time and third time.

13. The method for of claim 12, further comprising determining, by the controller, the third time based in part on a pseudo-random sequence.

14. The method for of claim 12, further comprising determining, by the controller, the fourth time based in part on a pseudo-random sequence.

15. The method for of claim 12, further comprising determining, by the controller, the third time by randomly choosing from two or more predetermined times.

16. The method for of claim 12, further comprising determining, by the controller, the fourth time by randomly choosing from two or more predetermined times.

17. The method for of claim 12, further comprising:

measuring, by a noise measurement circuit, electrical noise on the first terminal of the capacitor; and changing, by the controller, at least one capacitance measurement parameter in response to the measured noise.

* * * * *